Feb. 23, 1971 G. S. KAMATH 3,565,703
SILICON CARBIDE JUNCTION DIODE
Filed July 9, 1969
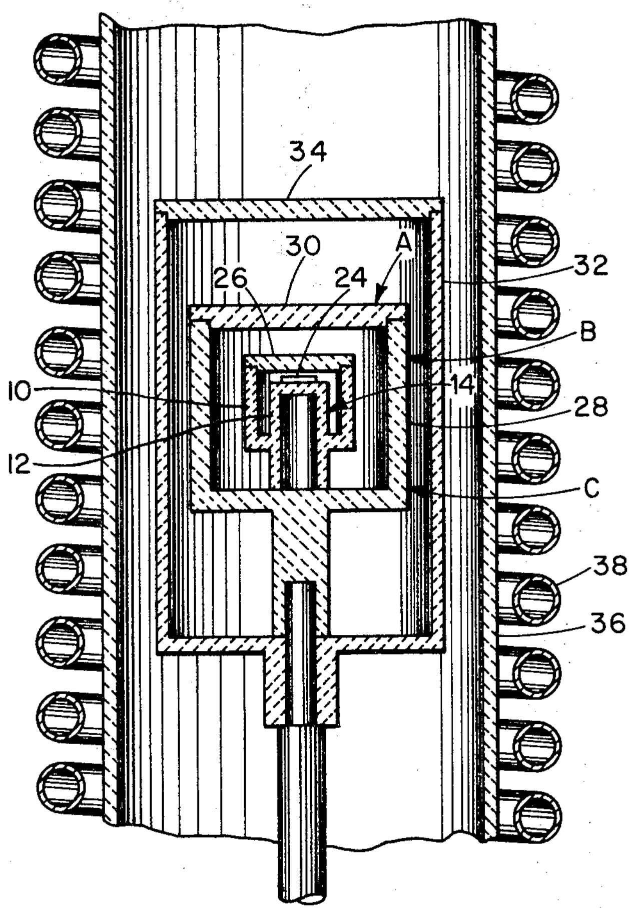

United States Patent Office 3,565,703

Patented Feb. 23, 1971

3,565,703

SILICON CARBIDE JUNCTION DIODE

G. Sanjiv Kamath, Wellesley, Mass., assignor to Norton Research Corporation, Cambridge, Mass., a corporation of Massachusetts Continuation-in-part of applications Ser. No. 659,690, Aug. 10, 1967, and Ser. No. 755,357, Aug. 26, 1968. This application July 9, 1969, Ser. No. 840,255

Int. Cl. H01l 7/36

U.S. Cl. 148—172 7 Claims

ABSTRACT OF THE DISCLOSURE

The production of electroluminescent silicon carbide junction diodes is described. These diodes are preferably produced by growth from a silicon carbide or carbon solution in silicon formed between a surface of a p or n-type silicon carbide crystal and a source of carbon atoms such as a block of solid carbon. The silicon contains one or more p or n-type impurities so that a p-n junction is formed on the crystal. The reaction takes place under a temperature gradient in the growth zone of less than about 10° C./inch and preferably at an elevated temperature (between about 2200° C. and 2600° C.).

This application is in part a continuation of copending application Ser. No. 659,690, filed Aug. 10, 1967, which in turn is a continuation-in-part of Ser. No. 755,357, filed Aug. 26, 1968.

This invention relates to an improved method of forming silicon carbide junction diodes, particularly light-emitting diodes.

SUMMARY OF THE INVENTION

The invention is particularly concerned with silicon carbide junction diodes and their production, wherein a light-emitting junction is formed by growing, for example, an epitaxial n-type layer on the surface of a p-type crystal.

A silicon carbide junction diode can be employed as an electroluminescent light source. For such use, it is desired that the junction have the lowest possible forward resistance. Also it is highly desirable that the epitaxial layer be mono-crystalline and free of crystalline defects, this being particularly true where another epitaxial layer is to be grown over the first epitaxial layer.

It is a principal object of the present invention to provide such diodes having a high output of visible light from a clear epitaxial layer which forms a p-n junction with an opaque base layer.

Another object of the invention is to provide improved methods of making such diodes with a high degree of crystalline perfection.

These and other objects of the invention will be obvious and will in part appear hereinafter.

For a fuller understanding of the nature and objects of the invention, reference should be had to the following detailed discussion thereof taken in connection with the accompanying drawing in which:

The figure is a diagrammatic, schematic representation of one embodiment of the invention.

The general method of the present invention is described in my copending application Ser. No. 659,690, filed Aug. 10, 1967. A silicon carbide junction diode is prepared by starting with a single substrate crystal of silicon carbide of one impurity type and growing a layer of silicon carbide containing another impurity type onto one surface of the substrate crystal while the impurities interdiffuse. When the starting material is a p-type silicon carbide crystal having a very high concentration of aluminum, for example, it is dark blue and almost opaque to visible light. If this crystal is subjected to a diffusion-epitaxial growth treatment wherein an n-type layer is grown on one surface of the crystal, a p-n junction will be formed. If the n layer is only lightly doped, it will be relatively transparent. The improved process and product of the present invention arises from the low temperature gradient (less than about 10° C./inch) and the substantially higher temperatures (above 2200° C.) used for the diffusion-epitaxial growth.

In order that the invention may be more fully understood, reference should be had to the figure and to the following nonlimiting examples:

EXAMPLE 1

A small graphite crucible 10 constructed from high purity graphite (less than 5 p.p.m. ash) was obtained from the Ultra Carbon Corporation. The crucible had the general shape shown in FIG. 1. The pedestal 12 was about 7/16" in diameter and the groove 14 was about 3/8" deep. The crucible was provided with a graphite cover 26 and was supported inside of a graphite susceptor chamber 28 1¾" in diameter by 1¼" deep. This susceptor had a graphite cover 30 and was positioned inside of split graphite heat shield 32 provided with a cover 34. This is surrounded by a quartz tube 36 about 24" long and 2½" in diameter. On the outside of the tube 36 was positioned an induction coil 38 energized by a 50 kw. radio frequency generator.

The graphite crucible 10 and pedestal 12 used in the layer growth are pretreated with silicon at about 1900° C. to impregnate the internal surface with a silicon carbide layer which enables it to withstand much higher temperatures during subsequent use. Such a crucible can be used repeatedly for further experiments. After this treatment, a substrate silicon carbide crystal 24 is placed as shown and a second charge of silicon is placed in the crucible. The substrate crystal 24 contained over 2000 parts per million nitrogen and was dark green and opaque. The bottom surface of the substrate crystal had been polished with ¼ micron diamond paste. The crystal had been etched in fused KOH at 600° C. for about 2 minutes. The "smooth" side was placed down on the pedestal. Resistivity of the crystal was approximately .05 ohm cm. and the mobility approximately 30 $cm.^2$/V-sec.

The tube 36 then was flushed with helium for 5 minutes. After flushing the helium gas flow was controlled at 2 cu. ft./hr. and the temperature raised to about 2400° C. for about 5 minutes.

When such a crucible is used, under the conditions of temperature specified, with 250 milligrams silicon, a layer of clear "n" type silicon carbide can be grown on the substrate $n^+$ crystal 24. The time for which the crucible has to be maintained at temperature is about 5 to 30 minutes largely depending on the temperature of operation. At the end of this time, the crucible contains no free silicon and the crystal can be lifted off the pedestal. This is in contrast to the conventional operation where the solution growth leaves the crystal in intimate contact with the graphite making it necessary to cut off the crystal and graphite, lap and polish it.

During the high temperature portion of the run, the temperature was recorded at the indicated points (see FIG. 1) by optical pyrometer (corrected) as follows: Point A, 2400° C.; Point B, 2405° C.; Point C, 2410° C. These readings were taken by sighting on the susceptor chamber through a slit in the split heat shield 32.

The resultant crystal had a clear n layer approximately 2 mils thick. This n layer was then ground and polished with ¼ micron diamond paste to a thickness of about 1 mil.

Thereafter a second layer was grown on the n layer by utilizing the technique described in Example 1 of my copending application Ser. No. 659,690, filed Aug. 10, 1967. This regrown layer was p type and very opaque due to the addition of boron to the silicon. This regrown p layer was then polished and treated as in Example 1 of the above-mentioned copending application to provide a diode consisting of an opaque $n^+$ layer, a thin (less than 1 mil thick) transparent n layer and a p layer substantially opaque on top of the transparent n layer. Both the $n^+$ and p layers were provided with contacts in the manner described in the above copending application.

EXAMPLE 2

A second run was made similar to Example 1 except that in this case the starting crystal was a p crystal containing over 200 parts per million aluminum. In this case the base crystal was dark blue and substantially opaque. A clear, transparent n layer was grown in the same fashion as outlined in Example 1 above to provide a p-n diode. This was similarly treated and an $n^+$ layer was grown on this diode by using the relatively lower temperature method described in the above-mentioned copending application. This provided a thin transparent n layer between two thicker opaque layers, the junction being at the boundary between the n and $p^+$ layers.

The diodes produced in the above two examples were polished and mounted in a camera and found to be very suitable for recording a sound track as described in copending application of Miller and Vitkus Ser. No. 556,408, filed June 9, 1966, now Pat. No. 3,508,015.

In Examples 1 and 2 above, the high temperature grown process embodied in the present invention has been described in conjunction with the growth of an n layer. It can be equally used to produce a p layer by adding boron, aluminum or other p-type impurity to the silicon employed during the growth process as set forth in the following examples:

EXAMPLE 3

A third run was made similar to Examples 1 and 2 with a starting crystal containing about 200 p.p.m. nitrogen (n type). A dark p type layer was grown on this crystal by a method similar to the others except for the following changes:

(1) 1 mg. boron and 5 mg. aluminum were added to about 600 mg. silicon to form the initial charge.

(2) The temperature used was 2480° C. (corrected); duration of the run 5 minutes.

At the end of the run crystals lifted off the pedestal and had a good dark epitaxial p layer on the original n type crystal to give a p-n junction.

The junction gave, on dicing, the following characteristics for a 40 x 40 mil die:

(1) Forward resistance $R_s$=10 ohms
(2) Reverse breakdown—20 v. for 1 ma.
(3) $Q_E$ for yellow light—$2\times10^{-5}$ The above quantities of boron and aluminum were used to reduce the forward resistance from about 100 ohms which is commonly obtained for a similar size die if only boron were used.

EXAMPLE 4

This run was similar to Example 3 except that only 5 mg. of aluminum were added to the silicon, there being no boron present. The resultant diode had a dark blue "p" layer and emitted light in the greenish blue region of the spectrum. The resistance of the diode was comparable to that of Example 3.

The use of aluminum alone as the "p" dopant (Example 4) gives a bluish light because aluminum has a shallower acceptor level than boron in the silicon carbide forbidden band gap thus giving rise to a photo emission with higher energy and higher frequency. It is also believed to be important for best quantum efficiency in a blue emitting diode to start with an "n" layer which has a relatively low (<100 p.p.m.) nitrogen content.

In connection with the use of boron as a dopant, it seems important to keep the boron concentration in the silicon relatively low. If this is not done, the crystal may have a tendency to stick to the pedestal. From a study of the Si-C-B phase system, it seems probable that, at the higher concentration of boron, carbides of boron may tend to segregate out of the melt and bind the melt and crystals to the pedestal.

The present invention provides for a crystallographically excellent, grown layer having desired optical properties. It is believed that the critically important features of the abovedescribed process are the very low temperature gradient (less than about 10° C./inch) in the growth zone and the very high temperature (about 2200° C. to 2600° C.). Without these two conditions the grown layer contains many crystallographic imperfections and is found to be rather firmly bonded to the carbon pedestal upon which the layer growth takes place.

It should also be emphasized that the presence of the cover 26 on the crucible 10 provides a confined zone which minimizes escape of silicon vapors from the interior of the crucible. The susceptor 28, with its cover 30, jointly with the outer heat shield 32 and its cover 34, contribute to the maintenance of a minimum temperature gradient within the interior of the crucible 10.

In the above discussion, reference has been made to measurement of temperature. This was achieved by use of a calibrated optical pyrometer. The readings were corrected by adding 80° C. to the measured reading to compensate for absorption by the quartz tube 38.

While several preferred examples of the invention have been described above, numerous changes may be made therein without departing from the spirit of the invention. For example, the concentration of an active impurity in the confined growth zone may be changed during the growth of the epitaxial layer so as to change the impurity concentration in this growing layer. Thus, for example, an n layer may be grown on a p base and after a predetermined period of time, nitrogen may be introduced into the helium normally used to increase the nitrogen concentration therein or to actually replace the helium entirely. This converts the growing epitaxial layer from an n layer to an $n^+$ opaque layer. By this technique a very thin transparent layer can be grown between two opaque layers.

Equally, by changing the temperature gradient so that the upper surface of the substrate crystal is hotter than the lower surface, the growth layer may be formed on the upper surface instead of the bottom surface as illustrated in the examples. In this case, it is equally as important that the temperature gradient be maintained less than 10° C./inch.

Since certain changes can be made in the above process without departing from the scope of the invention herein involved, it is intended that all matter contained in the above description shall be interpreted as illustrative and not in a limiting sense.

What is claimed is:

1. In the method of growing a silicon carbide epitaxial layer on a silicon carbide seed crystal wherein the silicon carbide seed crystal contacts a carbon surface which may or may not be wetted with silicon, wetting said carbon surface with silicon prior to said contacting step or subsequent thereto such that said silicon exists as a molten layer in contact with said seed crystal and said carbon surface, providing a temperature gradient between said crystal and said molten layer, the seed crystal, carbon surface and silicon layer being maintained at sufficiently elevated temperature between about 2200° C. to 2600° C. that there is solution of carbon at said carbon surface and epitaxial deposition of silicon carbide on a surface of said seed crystal, the improvement which comprises heating at said elevated temperature in a zone encompassing the carbon surface and seed crystal, which zone has a temperature gradient less than about 10° C./inch.

2. The method of claim 1 wherein the temperature is maintained at about 2400° C.

3. The method of claim 1 wherein the confined zone is substantially completely enclosed to minimize escape of silicon vapors from the confined zone.

4. The method of claim 1 wherein the confined zone includes an impurity for determining the conductivity type of the epitaxial layer.

5. The method of claim 1 wherein the elevated temperature is maintained until the region between the base crystal and the carbon surface contains essentially no free silicon.

6. The method of claim 1 wherein the concentration of a conductivity-determining impurity in the confined zone is changed during the growth of the epitaxial layer.

7. The method of claim 1 wherein the molten silicon exists between the carbon surface and the substrate crystal.

References Cited

UNITED STATES PATENTS

| | | | |
|---|---|---|---|
| 3,228,756 | 1/1966 | Itergenrother | 23—301 |
| 3,462,321 | 8/1969 | Vitkus | 148—1.5 |

L. DEWAYNE RUTLEDGE, Primary Examiner

R. A. LESTER, Assistant Examiner

U.S. Cl. X.R.

23—301; 148—1.5, 174, 175